(12) United States Patent
Ramadas et al.

(10) Patent No.: US 10,745,795 B2
(45) Date of Patent: Aug. 18, 2020

(54) INORGANIC GRADED BARRIER FILM AND METHODS FOR THEIR MANUFACTURE

(75) Inventors: Senthil Kumar Ramadas, Singapore (SG); Zin Ma Shwe, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 1262 days.

(21) Appl. No.: 12/990,485

(22) PCT Filed: Apr. 28, 2009

(86) PCT No.: PCT/SG2009/000154
§ 371 (c)(1),
(2), (4) Date: Mar. 15, 2011

(87) PCT Pub. No.: WO2009/134211
PCT Pub. Date: Nov. 5, 2009

(65) Prior Publication Data
US 2011/0151173 A1    Jun. 23, 2011

Related U.S. Application Data

(60) Provisional application No. 61/048,822, filed on Apr. 29, 2008.

(51) Int. Cl.
*B32B 1/06*     (2006.01)
*C23C 14/00*    (2006.01)
(Continued)

(52) U.S. Cl.
CPC ...... *C23C 14/0073* (2013.01); *C23C 14/0084* (2013.01); *C23C 14/0641* (2013.01);
(Continued)

(58) Field of Classification Search
USPC .................................................. 428/76, 685
See application file for complete search history.

(56) References Cited

U.S. PATENT DOCUMENTS 4,260,768 A     4/1981  Lorenz et al. ................. 548/261
6,017,614 A *   1/2000  Tsai .................. H01L 21/02211
                                                                428/209
(Continued)

FOREIGN PATENT DOCUMENTS

EP      1 164 644           12/2001
JP      05198568 A  *       8/1993
(Continued)

OTHER PUBLICATIONS

Machine_English_Translation_JP_08068990_A; Kikkai, Masaaki; Gas Barrier Type Low Moisture Permeable Insulating Transparent Substrate for Electrode and Its Use; Mar. 12, 1996; JPO; whole document.*

(Continued)

*Primary Examiner* — Tahseen Khan
(74) *Attorney, Agent, or Firm* — Seed IP Law Group LLP

(57) ABSTRACT

The present invention refers to a graded barrier film comprising a layered structure, wherein the layered structure comprises a first layer consisting of metal oxide; an intermediate layer consisting of metal nitride or metal oxynitride which is arranged on the first layer; and a third layer consisting of a metal oxide which is arranged on the intermediate layer. The present invention further refers to a sputtering method for manufacturing this graded barrier film and a device encapsulated with this graded barrier film.

19 Claims, 6 Drawing Sheets

(51) Int. Cl.
*H01L 23/00* (2006.01)
*H01L 31/0216* (2014.01)
*H01L 51/44* (2006.01)
*C23C 14/08* (2006.01)
*C23C 14/06* (2006.01)
*H01L 51/52* (2006.01)

(52) U.S. Cl.
CPC ............ *C23C 14/08* (2013.01); *H01L 23/564* (2013.01); *H01L 31/02167* (2013.01); *H01L 51/448* (2013.01); *H01L 51/5256* (2013.01); *H01L 2924/0002* (2013.01); *H01L 2924/12044* (2013.01); *Y02E 10/549* (2013.01); *Y02P 70/521* (2015.11); *Y10T 428/239* (2015.01); *Y10T 428/2495* (2015.01); *Y10T 428/24975* (2015.01); *Y10T 428/265* (2015.01); *Y10T 428/3154* (2015.04); *Y10T 428/31507* (2015.04); *Y10T 428/31511* (2015.04); *Y10T 428/31609* (2015.04); *Y10T 428/31663* (2015.04); *Y10T 428/31721* (2015.04); *Y10T 428/31739* (2015.04); *Y10T 428/31765* (2015.04); *Y10T 428/31786* (2015.04); *Y10T 428/31935* (2015.04); *Y10T 428/31938* (2015.04); *Y10T 428/31971* (2015.04)

(56) References Cited

U.S. PATENT DOCUMENTS

| 6,060,178 | A | * | 5/2000 | Krisko | C03C 17/36 |
| | | | | | 359/359 |
| 6,146,742 | A | * | 11/2000 | Hsieh | H01L 21/28061 |
| | | | | | 257/E21.2 |
| 6,495,251 | B1 | | 12/2002 | Arbab et al. | |
| 6,572,990 | B1 | * | 6/2003 | Oyama | B32B 17/10174 |
| | | | | | 156/106 |
| 6,624,568 | B2 | | 9/2003 | Silvernail | 313/504 |
| 6,733,874 | B2 | * | 5/2004 | Ueda | C23C 16/403 |
| | | | | | 428/216 |
| 6,737,753 | B2 | | 5/2004 | Kumar et al. | 257/787 |
| 2001/0016428 | A1 | | 8/2001 | Smith et al. | |
| 2003/0008219 | A1 | | 1/2003 | Kaneko et al. | |
| 2004/0224159 | A1 | * | 11/2004 | Oshika | C23C 16/0272 |
| | | | | | 428/408 |
| 2005/0051763 | A1 | | 3/2005 | Affinito et al. | 257/3 |
| 2005/0164042 | A1 | * | 7/2005 | Hayahi | C23C 16/30 |
| | | | | | 428/698 |
| 2006/0035111 | A1 | * | 2/2006 | Osada | C23C 16/32 |
| | | | | | 428/698 |
| 2007/0164376 | A1 | | 7/2007 | Burrows et al. | |
| 2007/0295388 | A1 | * | 12/2007 | Adriani et al. | 136/251 |
| 2009/0004440 | A1 | * | 1/2009 | Ban | B23B 27/141 |
| | | | | | 428/192 |
| 2009/0098372 | A1 | * | 4/2009 | Ishii | B24C 1/10 |
| | | | | | 428/335 |
| 2012/0003452 | A1 | * | 1/2012 | Tomita | C23C 16/0272 |
| | | | | | 428/216 |
| 2016/0060747 | A1 | * | 3/2016 | Kishiume | C23C 14/0641 |
| | | | | | 428/698 |

FOREIGN PATENT DOCUMENTS

| JP | 8-68990 A | | 3/1996 |
| JP | 08068990 A | * | 3/1996 |
| JP | 2007/118564 A | | 5/2007 |
| WO | 2005/073428 | | 8/2005 |
| WO | WO 2005073428 A1 | * | 8/2005 |
| WO | 2005/095924 | | 10/2005 |
| WO | 2007/145075 A1 | | 12/2007 |

OTHER PUBLICATIONS

Machine_English_Translation_JP_05198568_A; Furuhata, Tomoyuki; Manufacture of Semiconductor Device; Aug. 6, 1993; JPO; whole document.*

Graff et al., "Mechanisms of vapor permeation through multilayer barrier films: Lag time versus equilibrium permeation," *Journal of Applied Physics*, 96(4):1840-1849, 2004.

Lewis et al., "Thin-Film Permeation-Barrier Technology for Flexible Organic Light-Emitting Devices," *IEEE Journal of Selected Topics in Quantum Electronics*, 10(1):45-57, 2004.

Moro et al., "Process and design of a multilayer thin film encapsulation of passive matrix OLED displays," *Proceedings of SPIE*, 5214:83-93, 2004.

Schaepkens et al., "Ultrahigh barrier coating deposition on polycarbonate substrates," *Journal of Vacuum Science and Technology A*, 22(4): 1716-1722, 2004.

Weaver et al., "Organic light-emitting devices with extended operating lifetimes on plastic substrates," *Applied Physics Letters*, 81(16):2929-2931, 2002.

Kim et al., "Enlargement of grain in poly-Si by adding Au in Ni-mediated crystallization of amorphous Si using a $SiN_x$ cap layer," *J. Vac. Sci. Technol. A* 23(4):605-608, Jul./Aug. 2005.

Nicollian et al., *MOS Physics and Technology*, Wiley, New York, 2002, Chapter 16, "Models of the Interface," pp. 814-829.

Nisato et al., "P-88: Thin Film Encapsulation for OLEDs: Evaluation of Multi-layer Barriers using the Ca Test," *Society for Information Display*, 2003 International Symposium, Digest of Technical Papers, 2003, vol. XXXIV, pp. 550-553.

Wikipedia at Internet site, org/wiki/Silicon_nitride; Section: Electronics, 1 page, downloaded from Internet Sep. 10, 2014.

* cited by examiner 1.5 hours   3 hours   4.5 hours 0 hours   3 hours   4 hours   6 hours 0 hour   3 hours   4 hours   6 hours   7 hours 20 min 0 hour   3 hours   4 hours   6 hours   7 hours 20 min 0 hour　　　3 hours　　　4 hours　　　6 hours　　　7 hours 20 min

INORGANIC GRADED BARRIER FILM AND METHODS FOR THEIR MANUFACTURE

CROSS-REFERENCE TO RELATED APPLICATIONS

This application claims benefit of priority of U.S. provisional application No. 61/048,822, filed Apr. 29, 2008, the contents of it being hereby incorporated by reference in its entirety for all purposes.

FIELD OF THE INVENTION

The present invention relates generally to the field of barrier films, and more particularly to graded barrier films.

BACKGROUND OF THE INVENTION

Flexible plastic electronics, such as Organic Light Emitting Displays (OLEDs) are widely seen as the next generation display technology that will come to replace existing display technology.

One commonly known problem with OLED structures and other oxygen and/or moisture sensitive devices is that they degrade rapidly under atmospheric conditions. In order to protect them from degradation, various types of barrier films have been used to isolate the electroluminescent devices from the environment. It is estimated that for an OLED to achieve reliable performance with a lifetime exceeding 10,000 hours, the encapsulation around the reactive electroluminescent material of the OLED should have an oxygen transmission rate (OTR) less than about 5 to 10 cc/m$^2$/day and a water vapor transmission rate (WVTR) of less than about $10^{-5}$ g/m$^2$/day at 39° C. and 95% RH. An ideal bather film for a moist sensitive electronics combines the gas bather properties, chemical resistance and surface properties of glass, with the flexibility, toughness and processability of polymers.

However, commonly used polymer based barrier films which are used to isolate such sensitive structures from the atmosphere have their drawbacks. In general, polymer films 110 do not typically show high bather performance even if they are coated with a metal oxide coating 106 to improve their barrier properties, as they suffer from imperfections such as pinholes 103, cracks 102, gaps occurring at grain boundaries 101 etc. (see FIG. 4)

Integrity of the deposited coatings, such as metal oxide or metal nitride layers is a crucial factor in determining overall gas bather performance, and control of defects, such as pinholes, cracks and grain boundaries within the oxide or nitride layers is a critical requirement. When thickness of the bather film crosses its critical thickness during barrier film growth, cracks formation is observed as a result of intrinsic stresses. Barrier properties of thickness optimized barrier film, having typical thickness range of 30-60 nm, are limited by large pore size defects. The size of pinholes can be further reduced if the coating thickness is increased, but the intrinsic stress would be the limiting factor for the improvement of barrier properties because the intrinsic stress increases as thicker the oxide layer becomes (see FIG. 9).

Current multilayer barrier film technologies require a high quality single barrier oxide layer with less defects, lower stress, and excellent packing density. Conventional methods of fabricating barrier layers for barrier film application, including chemical vapor deposition, physical evaporation methods like electron beam evaporation and Filtered Cathodic Vacuum Arc (FCVA), result in inferior microstructure features, such as pinholes, which are detrimental to gas permeation barriers. This, in turn, affects the quality of multilayer barrier films, as they are built up from the single barrier films.

It is therefore an object of the present invention to overcome at least some of the above mentioned problems.

SUMMARY OF THE INVENTION

In a first embodiment, the present invention refers to a graded barrier film comprising a layered structure, wherein the layered structure comprises:
  a first layer of a metal oxide;
  a intermediate (second) layer of a metal nitride or a metal oxynitride which is arranged on the first layer; and
  a third layer of a metal oxide which is arranged on the intermediate layer.

In another aspect, the present invention refers to a method of manufacturing a graded barrier film according to any of the preceding claims in a single deposition cycle using sputtering technology, wherein the method comprises:
  depositing alternating layers of metal oxide and metal nitride or metal oxide and metal oxynitride on a substrate by mixing working gas used in the magnetron alternatively with a reaction gas which is either oxygen or nitrogen or a mixture of oxygen and nitrogen.

In still another aspect, the present invention refers to a device encapsulated with a graded barrier film obtained according to a method of manufacturing such a graded barrier film.

BRIEF DESCRIPTION OF THE DRAWINGS

The invention will be better understood with reference to the detailed description when considered in conjunction with the non-limiting examples and the accompanying drawings.

DETAILED DESCRIPTION

Figure 9:
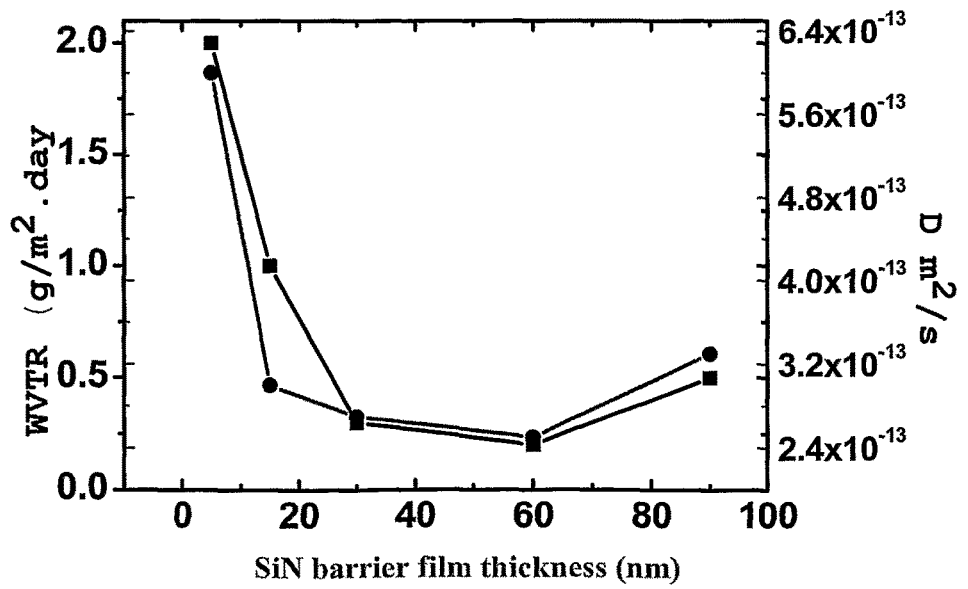
FIG. 9 illustrates the relationship between metal nitride thickness, water vapor transmission rate and diffusion rate. On the left y-axis the water vapor transmission rate (WVTR) is plotted while on the right y-axis the diffusion coefficient D ($m^2/s$) is plotted. On the x-axis the thickness of a metal nitride bather layer is plotted. The graph shows that the bather property increases with the thickness of the metal nitride layer (WVTR and D decrease). This is due to the fact that initially with an increasing layer thickness the size of the defects formed in the layer is small. The best bather properties are obtained with a metal nitride layer thickness between about 30 nm to about 60 nm. However, at a metal nitride layer thickness above 60 nm the barrier properties deteriorate because the intrinsic stress within the layer increases and larger defects in the metal nitride bather layer are formed due to the intrinsic stress within the growing layer (WVTR and D increased). As can be seen from Table 1 the same relationship exists also for metal oxide bather films.

Layers of metal oxide or metal nitride are used in the art to avoid degradation of moisture sensitive devices, such as OLEDs. Such layers of metal oxide or metal nitride are capable of adsorbing moisture and thus reduce the gas permeability in a more efficient manner than common plastic. As it is also known such layers of metal oxide or metal nitride comprise small defects, such as pinholes and cracks. As has been demonstrated in experiments (results shown in FIG. 9) using a metal nitride layer, the size of such defects decreases when increasing the thickness of the metal nitride layer. However, when increasing the thickness of the metal nitride layer the intrinsic stress within the layer leads to larger defects. As shown in FIG. 9, the best barrier properties are obtained with a metal nitride layer between about 30 to 60 nm while the barrier properties drop when the metal nitride layer is exceeding 60 nm because the defect size in the metal nitride layer increases due to the increasing intrinsic stress. Similar results (not shown) are obtained when testing a metal oxide layer and increasing its thickness.

The inventors have found that the thickness of a metal oxide layer or metal nitride layer can be further increased without a loss in the barrier properties if alternating layers of metal oxide and metal nitride or metal oxynitride are used. Thus, the present invention provides in a first embodiment an inorganic graded barrier film having a layered structure, wherein the layered structure comprises:

a first layer comprising or consisting of a metal oxide;
a second (intermediate) layer comprising or consisting of a metal nitride or metal oxynitride which is arranged on the first layer; and
a third layer comprising or consisting of a metal oxide which is arranged on the second (intermediate) layer.

The second layer is an intermediate layer or stress release layer comprising or consisting of a metal oxynitride or metal nitride. Introduction of the intermediate layer reduces the intrinsic stress which inevitable occurs if the thickness of the metal oxide layer is increased. Due to this intermediate layer the thickness of the metal oxide layer can be increased and thus the barrier properties improved. The advantageous effect of such a graded barrier film is illustrated by the results shown in FIG. 8 which were obtained in experiments conducted with a calcium sensor. A graded barrier film as described above prevents degradation for up to 207 h at a temperature of 60° C. and a relative humidity of 90%.

With "graded" barrier film it is meant that the layers are arranged in a series. In the present case the graded barrier film comprises alternating layers of metal oxide and metal oxynitride or metal nitride. The metal nitride or metal oxynitride layer is arranged on the first metal oxide layer. With arranged on it is meant that the layers are put in a specific sequence and are connected to each other.

Each of the layers of the graded barrier film can have a thickness of between about 10 Ångstrom to about 150 nm or 1 nm to about 100 nm or 1 nm to about 50 nm or 1 nm to about 25 nm or 10 nm to about 50 nm. In one embodiment, the second metal nitride or metal oxynitride layer is thinner than the first and third layer. In one example, the second layer is about 90, 91, 92, 93, 94, 95 or 96% thinner than the metal oxide layer it is arranged on. The thickness of the first and third metal oxide layer can be the same or different depending on the maximum desired thickness of the entire graded barrier film within the thickness ranges indicated herein.

The second layer can have a thickness of between about 10 Ångstrom, 50 Ångstrom, 100 Ångstrom, 500 Ångstrom or 1 nm and 29 or 25 nm. In another embodiment, the second metal nitride or metal oxynitride layer has a thickness of between about 10 Ångstrom, 50 Angstrom, 100 Ångstrom, 500 Ångstrom or 1 nm to about 20 nm, about 1 to about 15 nm, about 1 to about 10 nm, or about 1 to about 5 nm, or about 1 to about 3 nm, or about 1 to about 2 nm. In other examples, the second layer is about 1, 2, 3, 4, 5, 6, 7, 8, 9, 10, 15, 20, 25 or 28 nm thick. In case more than one intermediate layer is comprised in the graded barrier film, the thickness of the intermediate layers can be the same or different from each other within the thickness ranges indicated herein.

The metal oxide layer has a thickness between about 30 to about 60 nm, or about 40 to about 60 nm, or about 40 to about 50 nm, or about 50 to about 60 nm. In other examples, the second layer is about 30, 35, 40, 45, 50, 55 or 60 nm thick.

Figure 1:
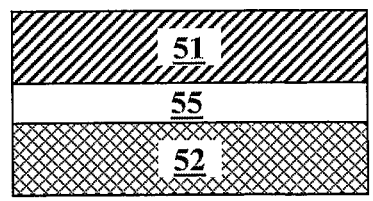
FIG. 1 shows the general structure of a graded barrier film according to an embodiment of the invention. An intermediate layer of a metal oxide nitride or metal oxynitride 55 is interposed between a first 52 and a second 51 metal oxide layer. Introducing an intermediate layer of a metal nitride or metal oxynitride allows to increase the thickness of the metal oxide barrier layer without increasing the intrinsic stress which leads to defects in the metal oxide barrier layer.
Figure 2:
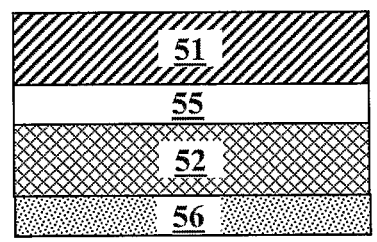
FIG. 2 shows another embodiment of a graded barrier film. In this embodiment, the graded barrier film as shown in FIG. 1 is arranged on a substrate 56.
Figure 3:
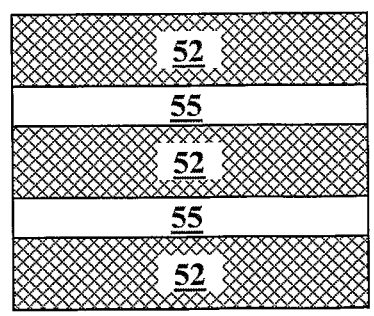
FIG. 3 shows the general structure of a graded barrier film according to a further embodiment of the invention. Compared to the embodiment of the graded bather film shown in FIG. 1, in this embodiment, the graded barrier film comprises more than three layers. In this embodiment two intermediate layers 55 are inserted in the metal oxide layer 52 thus creating a layered structure consisting of alternating layers of metal oxide and metal nitride or metal oxynitride. This structure can be further extended by adding further alternating layers of metal nitride or metal oxynitride and metal oxide.
Figure 4:
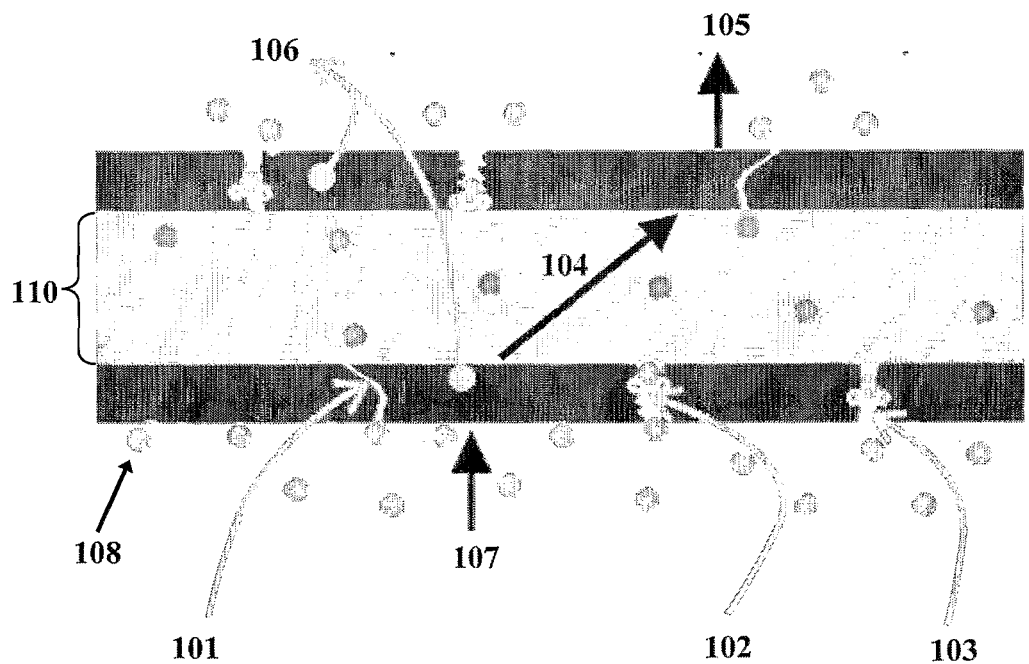
FIG. 4 illustrates the operation method of a barrier film known in the art and the limitations of such barrier films. This barrier film includes three different layers. Two metal oxide layers 106 which are interposed by a polymer layer 110. The metal oxide layers are applied on the top and bottom of the polymer layer to improve the barrier properties. Compared to polymers, metal oxides are known to adsorb water vapour (adsorption indicated by arrow 107) much better than polymer films. However, as already explained in the introductory part, the metal oxide layers comprise inherent structural defects, such as defects which occur at the boundaries of metal grains 101 which form the metal oxide layer; cracks 102, which can form upon bending of the flexible barrier film; and pinholes 103. The water molecules 108 can pass the metal oxide layer through these defects, diffuse through the polymer layer 110 (diffusion indicated by diagonal arrow 104) and are released from or through the surface (desorption) of the metal oxide layer 106 into the area in which the moisture sensitive device to be protected is positioned.

To increase the entire thickness of the graded barrier film it is also possible to apply further layers of metal nitride or metal oxynitride and metal oxide. Thus, in another embodiment, the graded barrier film comprises further layers; wherein a metal oxide layer is always followed by a metal nitride layer or metal oxynitride layer which is arranged on the metal oxide layer. An illustrative example of this embodiment (FIG. 3) shows a graded barrier film with three layers of metal oxide 53 interposed with second intermediate layers of metal nitride or metal oxynitride 55. The number of layers and thus the thickness of the graded barrier film can be further increased to further enhance the barrier properties if necessary. The entire graded barrier film can have a thickness (including every layer) between about 50 nm to about 1 μm, or about 50 nm to about 500 nm, or about 50 nm to about 300 nm, or about 50 nm to about 200 nm, or about 50 nm to about 100 nm. In one example, the entire thickness of the graded barrier film (without any substrate) is 50 nm, 60 nm, 70 nm, 80 nm, 90 nm, 100 nm, 110 nm, 120 nm, 125 nm, 130 nm, or 140 nm, or 200 nm, or 250 nm, or 300 nm.

The metal oxide, metal nitride or metal oxynitride can consist of metals which are reactive towards water and/or oxygen, i.e. metals which are above hydrogen in the reactivity series, including metals from Group 2 to 14 (IUPAC considering the IUPAC recommendations till 2006). Some preferred metals include those from Groups 2, 4, 10, 12, 13 and 14. For example, these metals may be selected from Al, Mg, Ba and Ca. Reactive transition metals may also be used, including Ti, Zn, Sn, Ni, and Fe for instance. In another embodiment, the metals include aluminium, gallium, indium, indium-doped tin, thallium, titanium, zirconium, hafnium, molybdenum, chromium, tungsten, zinc, silicon, germanium, tin, barium, strontium, calcium, magnesium, manganese, tantalum, yttrium and vanadium.

Examples of metal oxides that can be used in the graded barrier film include $TiO_2$, $Al_2O_3$, $ZrO_2$, $ZnO$, $BaO$, $SrO$, $CaO$ and $MgO$, $VO_2$, $CrO_2$, $MoO_2$, or $LiMn_2O_4$. In certain embodiments, the metal oxide may be a transparent conductive metal oxide selected from the group consisting of cadmium stannate ($Cd_2SnO_4$), cadmium indate ($CdIn_2O_4$), zinc stannate ($Zn_2SnO_4$ and $ZnSnO_3$), and zinc indium oxide ($Zn_2In_2O_5$).

Examples of metal nitrides that can be used in the graded barrier film include TiN, AlN, ZrN, $Zn_3N_2$, $Ba_3N_2$, $Sr_3N_2$, $Ca_3N_2$ and $Mg_3N_2$, VN, CrN or MoN. Examples of metal oxynitrides that can be used in the graded barrier film include $TiO_xN_y$ such as TiON, AlON, ZrON, $Zn_3(N_{1-x}O_x)_{2-y}$, SrON, VON, CrON, MoON and stoichiometric equivalents thereof. The metals in the first and third layer can be the same or different. The metal used in the second (stress release) layer can be the same as used in the first or third layer.

The metal oxide of the first and third layer can be different or the same. Also, in a further embodiment, in case multiple intermediate layers exist, the intermediate metal nitride or metal oxynitride layers can be of the same metal nitride or metal oxynitride or they can differ from each other. In still another embodiment, if multiple intermediate layers exist, the intermediate layers can be all metal nitride or metal oxynitride or can consist of a mixed layered structure including metal nitride as well as metal oxynitride layers. For example, the first metal layer can be made of $Al_2O_3$ followed by an intermediate CrN layer followed by a $MoO_2$ or $CrO_2$ layer. In a further example, the graded barrier film comprises of multiple alternating layers of metal oxide and metal nitride or metal oxynitride. In such an embodiment, the first metal layer can be made of $Al_2O_3$ followed by an AlN layer, followed by a $CrO_2$ layer, followed by an AlON layer, followed by another $CrO_2$ layer and so on.

In another embodiment, the first metal oxide layer can be followed by a metal oxynitride layer followed by a metal nitride layer, followed by the second metal oxide layer. Thus, in this embodiment, the intermediate layer comprises alternating layers of metal nitride and metal oxynitride.

For certain applications which require the graded barrier film to have good mechanical strength, a substrate may be provided to support the graded barrier film. The substrate may be flexible or rigid. The substrate can be an organic or inorganic polymer. For example, the substrate may comprise any suitable variety of materials such as polyacetate, polypropylene, cellophane, poly(1-trimethylsilyl-1-propyne, poly(ethylene-2,6-naphthalene dicarboxylate) (PEN), poly (ethylene terephthalate) (PET), poly(4-methyl-2-pentyne), polyimide, polycarbonate (PC), polyethylene, polyethersulfone, epoxy resins, polyethylene terephthalate, polystyrene, polyurethane, polyacrylate, polyacrylamide or polydimethylphenylene oxide. Further examples include microporous and macroporous polymers, such as styrene-divinylbenzene copolymers, polyvinylidene fluoride (PVDF), nylon, nitrocellulose, cellulose or acetate. Examples of inorganic polymers that can be used as substrate include silica (glass), indium tin oxide, nano-clays, silicones, polydimethylsiloxanes, biscyclopentadienyl iron, or polyphosphazenes and derivatives thereof, to name some illustrative examples. The substrate can also comprise a mixture of organic and inorganic polymers. These polymers can be transparent, semi transparent or completely opaque.

Polycarbonate is a useful substrate because it is compatible with plastic electronics fabrication processes. Polycarbonate is also transparent and can be cut into any desired dimension. Pneumatically operated hollow die punch-cutting equipment or any other conventional slitting machine can be used to slit samples into desired dimensions.

The substrate may be arranged to face the external environment and or it may face the environment encapsulated be the graded barrier film. In food packaging, the substrate may face the internal surface that is in contact with food while the graded barrier film forms the external surface in contact with atmospheric conditions.

The graded barrier film can be coated with further layers.

For example, to protect the graded barrier film from mechanical damage, the graded barrier film may be capped or overlaid with a terminal protective layer. The protective layer may comprise any material having good mechanical strength and is scratch resistant. In one embodiment, the protective layer comprises an acrylic film. The acrylic film can comprise LiF and/or $MgF_2$ particles distributed in the acrylic film.

The graded barrier film can also be coated with a UV neutralizing layer. A ultraviolet (UV) light neutralizing layer comprises a layer of material capable of filtering UV light. Many types of polymers can be used as basis for forming a UV neutralizing layer. Such polymer can include hydrocarbon plastics, thermoplastics, rubbers and inorganic polymers. Examples of suitable organic polymers are ultraviolet (UV) curable epoxies, polysulfides, silicone, polyurethane, polystyrene, polyalkylenes, polyimides, polybenzoxazoles and polyacrylates.

The polymers of the UV neutralizing layer can further include inorganic as well as organic materials, for example protective coatings which include titanium oxide and zinc oxide nanoparticles, and chemical compounds that are able to absorb the UV rays. Exemplary UV filter material include, but are not limited to, oxides such hafnium dioxide ($HfO_2$), magnesium oxide (MgO) or barium oxide (BaO) all of which can provide low refractive oxide optical films. Titanium dioxide ($TiO_2$), tantalum oxide ($Ta_2O_5$), silicone oxide ($SiO_2$), zirconium oxide ($ZrO_2$), indium tin oxide (ITO), and zinc oxide (ZnO) nanoparticles may also be used. Indium tin oxide (ITO), and zinc oxide (ZnO) are examples of materials that provide high refractive oxide optical films. All of these mentioned metal oxides may be incorporated within the UV light neutralizing layer (such as an epoxy adhesive layer) serving to absorb, reflect and scatter incident UV thereby preventing the UV from reaching any device which is located under the graded barrier layer. Further suitable materials that be used as UV filtering material include inorganic halides such as magnesium fluoride ($MgF_2$) or barium fluoride ($BaF_2$). In some embodiments, hafnium dioxide (hafnia) may be combined in multilayers with silicon dioxide to obtain hard, scratch-free, dense and adherent coatings. In addition, it is also possible to use organic materials such as carbon nanotubes as UV absorbing material.

Alternatively or in addition, chemical coatings which absorb incident UV and radiate it in a secondary form of energy may also be used in place of or in conjunction with physical coatings. In one embodiment, the UV neutralizing layer comprises a layer of UV light absorber material. Examples include 4-Methylbenzylidene camphor and benzotriazole. Another compound that can be used is 2-ethyl-hexyl methoxy cinnamate, which uses incident UV to bring about cis-trans photo isomerization of the compound.

In one exemplary embodiment, the UV neutralizing layer comprises copolymerisable benzotriazole compounds such as those disclosed in U.S. Pat. No. 4,260,768. Due to the availability of an unsaturated double bond in such compounds, contributed by side chains comprising acryloyl and methacryloyl radicals for example, such compounds can be advantageously copolymerised with the above-mentioned monomers that are used to form the UV neutralizing layer, thereby adding an additional layer of UV protection.

In OLED applications, the graded barrier film may be laminated over any part of an encapsulation for isolating the active component of the OLED device. In one embodiment, the graded barrier film is used to form a base substrate for supporting the reactive layers of the electroluminescent component. In a rim-sealing structure, the graded barrier film may be used to form a rigid cover that is arranged over the reactive layers of the electroluminescent component. The rigid cover may be attached to the base substrate by means of an adhesive layer, the adhesive layer being arranged at least substantially along the edge of the cover substrate for forming an enclosure around the reactive component. In order to minimise lateral diffusion of oxygen/moisture into the enclosure containing the reactive component, the width of the covering layer or the adhesive layer may be made larger than the thickness of the graded barrier film.

It is to be understood that the graded barrier layer can be used to protect any device from moisture, e.g. by encapsulating such devices with the graded barrier film. With encapsulating it is meant that the graded barrier film is used to enclose the device to isolate it from the outside environment. Encapsulation does not necessarily require that the graded barrier film is coated onto the device but only that it surrounds the environment in which the device is positioned. Therefore, in one embodiment the invention refers to a device encapsulated with a graded barrier film.

The graded bather film is suitable for encapsulation of any object or device, including electronic components. Some examples of electronic components include passive and active Organic Light Emitting Devices (OLEDs), charged-coupled devices (CCDs), micro-electro-mechanical sensors (MEMS), thin film transistors (TFT), and organic or inorganic photovoltaic devices based on a thin film solar cell including but not limited to a $Cu(InGa)Se_2$ solar cell, a Dye-sensitized solar cell (DSSC), a CdS/CdTe solar cell, a Copper-Indium Selenide solar cell (CIS) and a copper indium/gallium diselenide solar cell (CIGS).

In context with photovoltaic devices, such as solar cells that can include a graded barrier film it is noted that the current market is being driven by the inherent advantages of Thin Film Photovoltaics (TFPV includes CIGS, CdTe, DSSC technologies) including low cost, low weight, and the ability to manufacture them on flexible substrates and embed solar power capabilities into walls, roofs and even windows. Unlike more conventional Photovoltaics (PV) that uses crystalline silicon, TFPV also has the ability to operate under low light conditions. By contrast TFPV can be manufactured using simple printing or other roll-to-roll (R2R) machines using flexible substrates as the substrates described above and flexible encapsulation methods. The currently used encapsulation methods do not provide sufficient barrier properties and therefore, the life time of flexible PVs is estimated only 2 to 3 years life time. For example, current DSSC photovoltaic devices are highly sensitive to oxygen and moisture. The indium tin oxide, electrolyte and sensitizing dye of the devices are sensitive with water vapor and oxygen.

The graded barrier film described herein can also be used to improve the barrier properties of existing barrier film materials which are known in the art.

The graded barrier film can be manufactured by means of sputtering. Sputtering is a physical process of depositing thin films by controllably transferring atoms from a source to a substrate which is known in the art. The substrate is placed in a vacuum chamber with the source material, named a target, and an inert working gas (such as argon) is introduced at low pressure. A gas plasma is struck in radio frequency (RF) or direct current (DC) glow (ejection of secondary electrons) discharged in the inter gas, which causes the gas to become ionized. The ions formed during this process are accelerated towards the surface of the target, causing atoms of the source material to break off from the target in vapor form and condense on the substrate.

Besides RF and DC sputtering, magnetron sputtering is known as third sputtering technique. For magnetron sputtering, DC, pulsed DC, AC and RF power supplies can be used, depending upon target material, if reactive sputtering is desired and other factors. Plasma confinement on the target surface is achieved by locating a permanent magnet structure behind the target surface. The resulting magnetic field forms a closed-loop annular path acting as an electron trap that reshapes the trajectories of the secondary electrons ejected from target into a cycloidal path, greatly increasing the probability of ionization of the sputtering gas within the confinement zone. Positively charged argon ions from this plasma are accelerated toward the negatively biased target (cathode), resulting in material being sputtered from the target surface.

Magnetron sputtering differentiates between balanced and unbalanced magnetron sputtering. An "unbalanced" magnetron is simply a design where the magnetic flux from one pole of the magnets located behind the target is greatly unequal to the other while in a "balanced" magnetron the magnetic flux between the poles of the magnet are equal. Compared to balanced magnetron sputtering, unbalanced magnetron sputtering increases the substrate ion current and thus the density of the substrate coating.

In the present invention the novelty of the sputtering process is based on the use of oxygen and nitrogen reactive ions in an alternating sequence. Using oxygen and nitrogen reactive ions the process for manufacturing a graded barrier film is as follows. A metal layer of a few monolayers is deposited. Subsequently, oxygen is introduced to the system to create oxygen plasma which is directed towards the substrate to provide argon and oxygen ion bombardment to achieve a high packing-density oxide film. A metal nitride or oxynitride layer is formed in the same manner. At first, a metal layer of a few monolayers is deposited and subsequently the nitrogen or the mixture of nitrogen and oxygen (for a metal oxynitride layer) is introduced into the reaction chamber of the sputtering device to create a nitrogen plasma or a oxygen/nitrogen plasma.

The plasma also increases reactivity of oxygen or nitrogen or the mixture of oxygen and nitrogen directed onto the growing film surface, and provides for more desirable structures. The first layer of metal oxide grows to the desired thickness. After the metal oxide layer reaches the desired thickness the oxygen flow into the reaction chamber of the sputtering device is switched of and another few monolayers of metal are deposited on the already existing metal oxide layer. After formation of these initial monolayers, nitrogen is fed into the reaction chamber to form a metal nitride layer. In case a layer of metal oxynitride is to be manufactured a mixture of nitrogen and oxygen is fed into the reaction chamber. The elemental deposition and anodization can be continuously repeated until the desired thickness of the graded barrier layer is obtained.

Therefore, in one aspect to the present invention refers to a method of manufacturing a graded barrier film in a single deposition cycle using sputtering technology, wherein the method comprises:

depositing alternating layers of metal oxide and metal nitride or metal oxide and metal oxynitride on a substrate by mixing working gas used in the magnetron alternatively with a reaction gas which is either oxygen or nitrogen or a mixture of oxygen and nitrogen.

In one embodiment the depositing is carried out by sputtering monolayers of a metal onto the substrate; feeding oxygen or nitrogen or a mixture of oxygen and nitrogen with the working gas to form reactive oxygen or nitrogen or oxygen and nitrogen for anodizing the metal layer for the formation of metal oxide and metal nitride or metal oxynitride, respectively.

The sputtering technology used can be RF sputtering or DC sputtering or magnetron sputtering, either a DC or AC magnetron. In one embodiment the magnetron sputtering is balanced or unbalanced magnetron sputtering. The sputtering technique can provide self bias at the substrate from −10 V to −30 or −25 V. The incident current density can be between about 2 mA/cm$^2$ to about 10 mA/cm$^2$, or between about 2 mA/cm$^2$ to about 5 mA/cm$^2$, or between about 4 mA/cm$^2$ to about 10 mA/cm$^2$. A high current density allows depositing dense layers of metal oxide, metal nitride or metal oxynitride without introducing excessive intrinsic stresses. The deposition of metal oxide, metal nitride or metal oxynitride can occur at room temperature.

A suitable continuous feed back control loop (e.g. plasma emission monitor control loop) can be used to control the gas flow of oxygen and nitrogen according to the sputter target status. A precise flow controller is placed within the control loop to adjust oxygen and nitrogen flow in an alternating sequence for any given time period.

Figure 7:
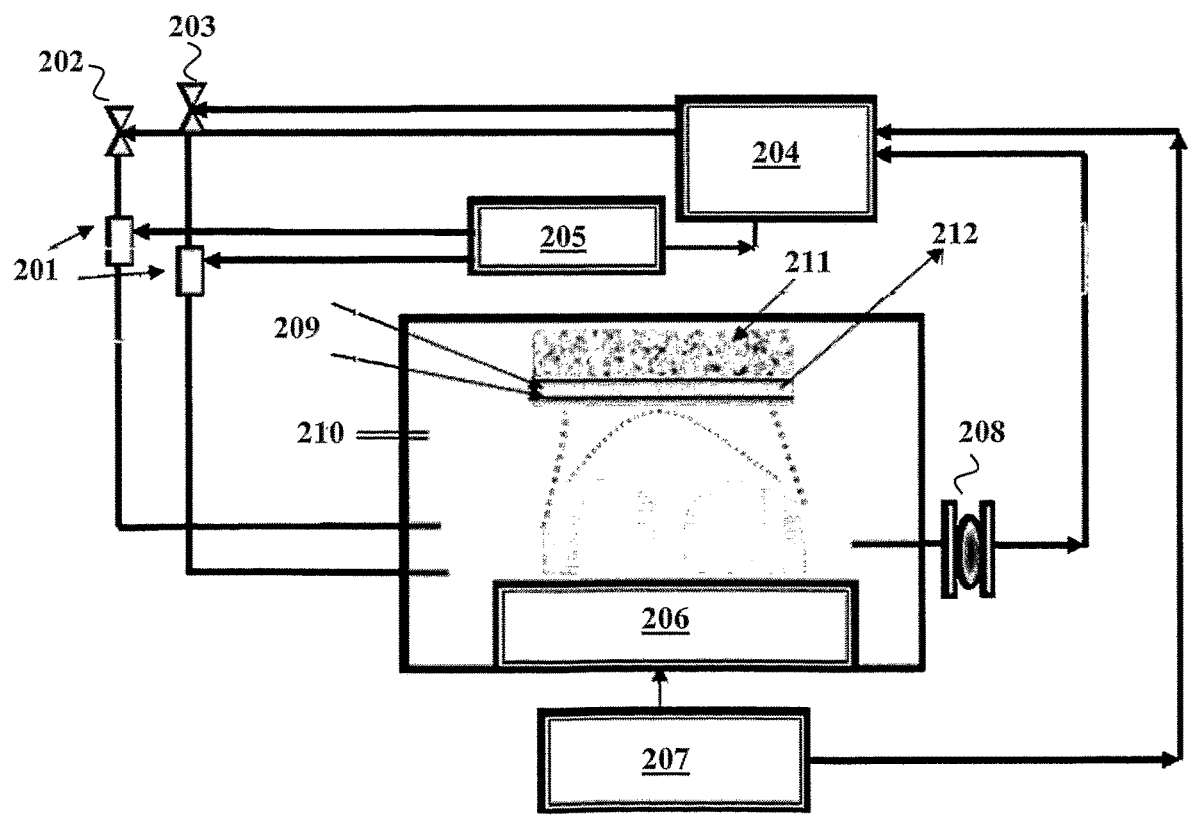
FIG. 7 illustrates the general set-up of a magnetron sputtering system using a pulsed reactive plasma system which is used in one embodiment of the invention for manufacturing the graded barrier film. Magnetron sputtering can be used to deposit the graded barrier layer onto the planarising substrate. Unbalanced magnetron sputtering technique can be used to form high density oxide bather films. In this sputtering technique, a metal layer of typically a few mono-layers will be deposited from an unbalanced magnetron, and then oxygen or nitrogen will be introduced to the system to create oxygen or nitrogen plasma, directed towards the substrate to provide argon and oxygen or nitrogen ion bombardment for a high packing-density graded barrier film. Plasma helps to increase the reactivity of the oxygen and nitrogen directed onto the growing film surface and provides for more desirable film stoichiometry. In order to deposit dense films without introducing excessive intrinsic stresses, a high flux (greater than 2 mA/cm$^2$) of low energy (~25 eV) oxygen and argon ions to bombard the growing bather oxide films.

FIG. 7 illustrates an embodiment in which a magnetron is used for the manufacture of a graded barrier film. The flow of gases in the reaction chamber of the magnetron 206 is controlled by a Plasma Emission/Voltage Pulsing Unit 204. The Plasma Emission/Voltage Pulsing Unit 204 which controls the flow of oxygen and nitrogen through the valves 203 (oxygen) and 202 (nitrogen) is connected to the flow controller 205 which controls the valves, such as piezoelectric valves 201. The control of the valves 201 through the flow controller 205 allows controlling the flow of oxygen and nitrogen into the reaction chamber of the magnetron 206. The light emitted by the sputtering metal in the intense plasma of the magnetron reaction chamber (racetrack) is an indicator of the metal sputtering rate and the oxygen partial pressure and is measured by the photomultiplier 208. This indicator can be used to control the process and hence achieve an accurate oxide film stoichiometry.

The photomultiplier is connected to the Plasma Emission/Voltage Pulsing Unit 204 for data transmission. The magnetron 206 is connected to a power supply 207 which is controlled by the Plasma Emission/Voltage Pulsing Unit 204. In FIG. 7 a substrate 211 is shown to be coated with a graded barrier film having already two layers of metal oxide 209 and an intermediate metal nitride or metal oxynitride layer 212. The magnetron shown in FIG. 7 uses a continuous feedback control unit, namely the Plasma Emission/Voltage Pulsing Unit 204, from a plasma emission monitor, which allows obtaining reproducible films and desirable barrier properties.

Experiments

Surface Preparation

Substrates that are used as support structure for the graded barrier film are rinsed with isopropyl alcohol (IPA) and blown dry with nitrogen. These processes help to remove macro scale adsorbed particles on the substrate surface. Acetone and methanol cleaning or rinsing can be carried out but is not recommended.

Subsequently, substrates are placed in a vacuum oven at a pressure of $10^{-1}$ mbar for degassing absorbed moisture or oxygen. The vacuum oven is equipped with fore line traps to prevent back migration of hydrocarbon oil from vacuum pump to the vacuum oven.

Immediately after degassing, substrates are transferred to the plasma treatment chamber (e.g. ULVAC SOLCIET, Cluster Tool). Radio Frequency (RF) argon plasma is used to bombard surface of the barrier film with low energy ions to remove surface contaminants. Base pressure in the chamber was maintained below $4\times10^{-6}$ mbar. Argon flow rate is 70 sccm ($116.2*10^{-3}$ Pa$*$m$^3$/s). RF power is set at 200 W, and an optimal treatment time, depending on the surface condition, of usually 5 to 8 eight minutes was used.

Metal Oxide Barrier Layer Coating

Sputtering technique was used to deposit the metal oxide barrier layer. An unbalanced magnetron sputter system is used to develop high density oxide barrier films. In this sputtering technique, a metal layer of typically a few monolayers is deposited from an unbalanced magnetron. Subsequently, oxygen is introduced to the system to create oxygen plasma which is directed towards the substrate to provide argon and oxygen ion bombardment to achieve a high packing-density oxide film. This plasma also increases reactivity of oxygen directed onto the growing film surface, and provides for more desirable structures. In order to deposit dense films without introducing excessive intrinsic stresses, a high flux (greater than 2 mA/cm$^2$) of low energy (~25 eV) oxygen and argon ions are used to bombard the growing barrier oxide films.

A continuous feedback control unit is used to control the reactive sputtering processes. The light emitted by the sputtering metal in the intense plasma of the magnetron racetrack is one indicator of the metal sputtering rate and the oxygen partial pressure. This indication can be used to control the process and hence achieve an accurate oxide film stoichiometry. By using a continuous feedback control unit from a plasma emission monitor, reproducible films and desirable bather properties are obtained.

Various barrier layers including silicon nitride (SiN), aluminium oxide ($Al_2O_3$), and indium tin oxide (ITO) are prepared by conventional and unbalanced magnetron sputtering techniques and the single barrier layer properties are tested.

Example: Calcium Degradation Test on Graded Barrier Film

After the plasma treatment process, the barrier films are transferred to a vacuum evaporation chamber (thermal evaporation) under vacuum. The barrier films are then evaluated for their bather properties using the calcium sensor described in WO 2005/095924. The calcium sensors referred to in WO 2005/095924 allow qualitative evaluation and quantitative evaluation. An example for a calcium sensor that allows qualitative evaluation is illustrated in FIG. 5, while a calcium sensor that allows a quantitative evaluation is illustrated in FIG. 6.

Figure 5:
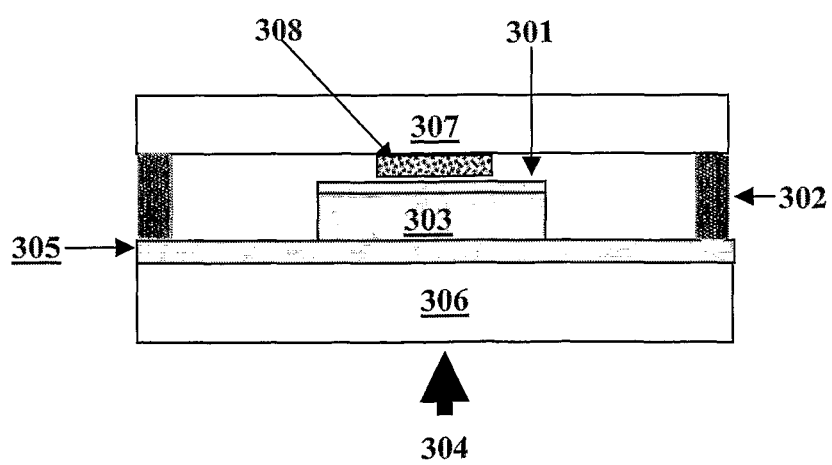
FIGS. 5 and 6 show a setup for carrying out an investigation of the barrier film properties of fabricated barrier films using a calcium sensor.

In qualitative evaluation, a test cell as shown in FIG. 5 is formed using the fabricated encapsulation bather films. Briefly, two metal tracks with dimensions of 2 cm by 2 cm are fabricated. A sensing element having dimensions of 1 cm length, 2 cm width and 150 nm thickness is formed in between the two electrodes. The measured resistivity of the sensing element is 0.37 Ω-cm. After the deposition process, a load lock system is used to transfer the sample to a glove box under dry nitrogen at atmospheric pressure. After the calcium deposition 303, a 100 nm silver protection layer 301 was deposited for the qualitative analysis in the test cell shown in FIG. 5.

The test cell shown in FIG. 5 comprises of a substrate 306 coated with the bather film 305 to be tested. As already described, the calcium sensor 303 is coated with a silver layer 301 and arranged in a chamber which is isolated at its side with a UV curable epoxy resin 302 and is sealed off to the top with a glass slide 307. A getter material 308 is attached to the cover glass slide to adsorb any water vapor produced as a result of out gassing or permeation through the epoxy sealing.

Figure 6:
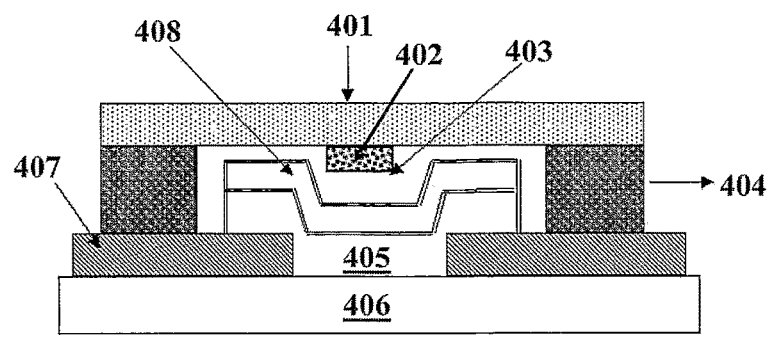

For a quantitative resistance measurement, the test cell shown in FIG. 6 was used. The general set-up of such a test cell comprises a calcium sensor cell which incorporates an encapsulation/sealant 404 comprising an UV curable epoxy and a glass cover substrate 401. A layer of encapsulation 404 (epoxy sealant) is applied on a pair of metal (conductive) tracks 407 constituting the electrodes. Calcium is used as sensing element 405 and the top of the sensing element 405 surface is covered with a protective layer 408. The glass cover substrate 401 is placed on the encapsulation, thereby sealing the sensing element. The hollow space 403 enclosed above the sensing element is filled with nitrogen.

For the experiments described herein, 300 nm silver was used for the conductive track, 150 nm calcium was used as the sensor 405, and 150 nm lithium fluoride was used as a protection layer 408. After the deposition processes, a UV curable epoxy 404 was applied on the rim of the barrier film 406 (please note that in FIG. 6 it appears due to the way of graphical presentation that the UV curable epoxy is applied on the metal tracks. However, in fact the UV curable epoxy is applied on the barrier film) and the whole substrate was sealed with a 35 mm×35 mm glass slide 401. As for the sensor cell shown in FIG. 5, the getter material 402 was attached to the 35 mm×35 mm cover glass slide 401 to absorb any water vapor as a result of out gassing or permeation through the epoxy sealing 404. A load lock system was used for the entire process and the test cells were encapsulated in the glove box under dry nitrogen at atmospheric pressure.

To accelerate the permeation tests, the samples were placed into a humidity chamber at constant temperature and humidity of 60° C. & 90% relative humidity (RH), respectively. The samples were viewed optically at regular intervals for the qualitative degradation test and analysis of the defects, and measured electrically for the quantitative degradation test.

The calcium test cell's conductive track terminals are connected to a constant current source (Keithey source meter), which is interfaced with a computer. Resistance of the calcium sensor/silver track is monitored every second and plotted automatically by the computer using LabVIEW software. A Dynamic Signal Analyzer with a Fast Fourier Transform (FFT) analysis is used to take the noise spectrum measurement automatically at periodic intervals of one second.

Example: Conventional Barrier Film Growth & Thickness Dependence

The barrier properties of SiN films on poly(ethylene terephthalate) (PET) substrates depend on their microstructure and film growth conditions. In order to understand the film growth, SiN film of thickness 5 nm, 15 nm, 30 nm, 60 nm, & 90 nm were deposited on PET substrates.

Factors affecting the various stages of film formation were investigated using SiN films of thickness ranging from 5 nm to 90 nm. Possible factors influencing the film growth are surface morphology, surface cleaning, deposition conditions and deposition technology.

Heterogeneous nucleation film modification at the gas/solid interfaces is an important first step in the growth of a thin film. The quasi-stable islands grow in size rather than in number, eventually growing large enough to touch each other. In plasma deposition, atoms arrive at the surface and expend their energy received from the plasma and ion bombardment. Island growth depends strongly on mobility of atoms, which in turn scales with energy received from ion bombardment. Growth of the islands is also dependent on substrate morphology, deposition rate and surface energy.

Figure 10:
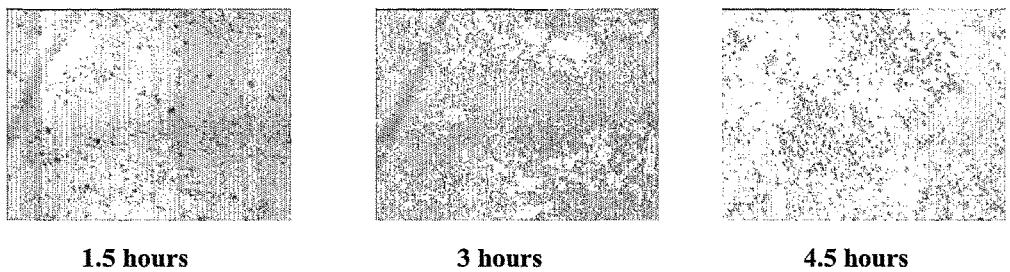
FIG. 10 shows the calcium degradation pattern of a SiN film with a thickness of 5 nm on PET substrate after 1.5 h, 3 h and 4 h (from left to right).

Calcium degradation images are shown in FIG. 10 for 5 nm thick SiN coated on PET substrate. Image with calcium degradation at 3 h showed that initial film growth with a thickness of 5 nm was not continuous, and could be related to island growth stage in nucleation theory. Clusters of calcium degradation show that there is poor coverage of SiN across the surface and which mirrors the island growth of SiN.

Figure 11:
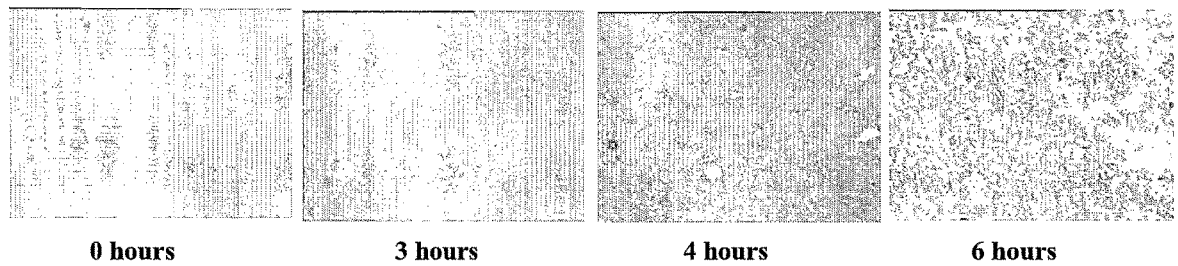
FIG. 11 shows the calcium degradation pattern of a SiN film with a thickness of 15 nm on PET substrate after 0 h, 3 h, 4 h and 6 h (from left to right).

When the islands grow large enough to come into contact, they coalesce. Coalescence of two-rounded island is characterized by a decrease in total projected area of islands on the substrate and increase in height. This behaviour leads to secondary nucleation of the uncovered areas on the polymer substrate. FIG. 11 shows the coalescence behaviour of 15 nm thick SiN film.

Figure 12:
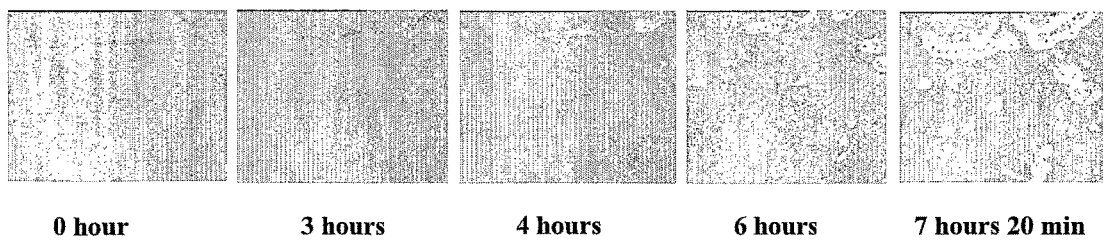
FIG. 12 shows the calcium degradation pattern of a SiN film with a thickness of 30 nm on PET substrate after 0 h, 3 h, 4 h, 6 h, and 7 h 20 min.

The film becomes continuous in the coalescence stage. Depending on the deposition technology, the mean film thickness at which this occurs can vary. Earlier theoretical studies have found that sputtered films become continuous at a lower thickness than evaporated films, and this was attributed to a higher reactive and argon ion bombardment associated with sputtering. FIG. 12 shows the calcium degradation pattern for 30 nm SiN film on PET substrate.

Figure 13:
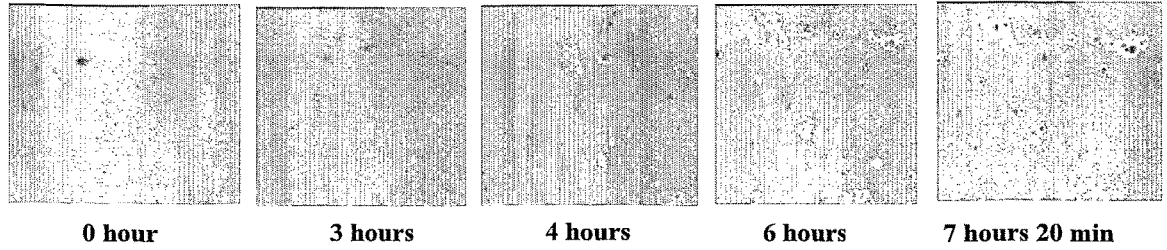
FIG. 13 shows the calcium degradation pattern of a SiN film with a thickness of 30 nm on PET substrate (no substrate bias) after 0 h, 3 h, 4 h, 6 h, and 7 h 20 min.

The SiN films were prepared with RF sputtering. However, no substrate bias was used during film growth. If the substrate bias is not used, then there is no ion bombardment during the film growth. Ion bombardment during the film growth provides an increased packing density of the film. Holes, channels, crack and pores could be observed in the continuous SiN film in FIGS. 12 and 13.

Figure 14:
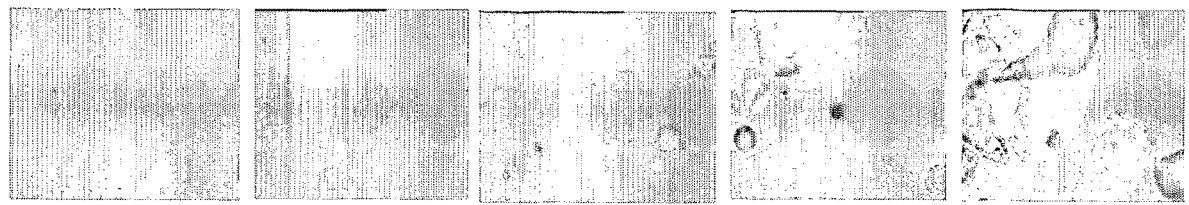
FIG. 14 shows the calcium degradation pattern of a SiN film with a thickness of 90 nm on PET substrate after 0 h, 3 h, 4 h, 6 h, and 7 h 20 min.

Calcium Degradation Test (CDT) images of FIG. 14 show that 90 nm thick SiN is not oxidised after 4.5 h. This lag time can be explained as time required for water vapour to diffuse through the 90 nm thick SiN layer. Diffusion occurs through micro or nano scale defects after 6.5 to 7.5 h and the calcium sensor is oxidized. Deterioration in barrier performance could be attributed to cracks arising from the release of internal stress, which occurs beyond a critical thickness value of about 60 nm for a barrier film.

The water vapor transport properties were analyzed quantitatively with CDT method for 5 nm, 15 nm, 30 nm, 60 nm and 90 nm thick SiN coating on PET substrate. The Water Vapor Transport Rate (WVTR) dependence with film thickness is shown in FIG. 9.

5 nm thick of SiN coated on PET substrates demonstrated a WVTR of 2 g/m$^2$/day, close to WVTR values for plain PET. 15 nm SiN coated on PET substrate demonstrated an improvement of a factor of 10, compared to 5 nm thick SiN. 60 nm showed an improvement of a factor of 18, compared to 5 nm thick SiN films.

The critical thickness of SiN is 60 nm, beyond which the water vapor transmission rate (WVTR) increases considerably. This is attributed to increase in intrinsic stress which is characterized by cracks.

The diffusion coefficient was calculated based on the lag time method. SiN film coated on PET substrate is assumed to be a single homogenous barrier stack and the diffusion coefficient was plotted together with WVTR. The behaviour of the diffusion coefficient is similar to that for WVTR. Therefore, WVTR depends on the diffusion coefficient of the film, which in turn depends on the film microstructure.

Example: Graded Barrier Structure

Barrier film growth analysis together with thickness dependence studies have shown a critical thickness of 60 nm, above a thickness of 60 nm crack formation was observed due to intrinsic stresses of the barrier coatings. At an optimal thickness of 50 nm, barrier film still exhibits large pore size defects. However, the size of the pinholes can be further reduced if coating thickness is increased, but intrinsic stresses would be the limiting factor for the improvement of barrier properties.

The new graded barrier film structure tested herein consists of aluminium oxide/aluminium nitride/aluminium oxide, which is fabricated on a plastic substrate in a single deposition cycle using magnetron sputtering method with alternate oxygen and nitrogen gas flow. The role of aluminium nitride in reducing intrinsic stresses of graded barrier structure, as well as a comparison of the overall water vapor permeation properties versus conventional single barrier layer with an optimized thickness of 50 nm is investigated.

A conventional magnetron sputtering system is used to demonstrate the concept of graded barrier structure. A magnetron power 100 W was used with an argon gas flow rate of 5 SCCM (sccm=cubic centimetres per minute at standard temperature and pressure) (8.3*10$^{-3}$ Pa*m$^3$/s) and oxygen and nitrogen reactive gases flow rate was optimized as 4 SCCM (6.7*10$^{-3}$ Pa*m$^3$/s) and 3 SCCM (5*10$^{-3}$ Pa*m$^3$/s), respectively. The aluminium oxide and aluminium films were deposited on PET substrates at the rate of 8 nm/min and 7 nm/min, respectively. In general, the oxygen and nitrogen partial pressure depends on the sputter chamber that is used. For example, for lab scale chambers of a sputtering system partial pressures of oxygen and nitrogen of between about 15 sccm to 60 sccm (24.9*10$^{-3}$ Pa*m$^3$/s to 99.6*10$^{-3}$ Pa*m$^3$/s) can be used. For large scale sputtering chamber, partial pressures of oxygen and nitrogen of between about 100 sccm to 150 sccm (166*10$^{-3}$ Pa*m$^3$/s to 249*10$^{-3}$ Pa*m$^3$/s) can be used. Thus, the partial pressure for the reactive gases depends also on the sputtering system used.

Three samples were prepared, namely:

Sample 1: 60 nm thickness of aluminium oxide coated on PET substrate

Sample 2: 50 nm thickness of aluminium nitride coated on PET substrate

Sample 3: 125 nm thickness of graded barrier structure which comprises of aluminium oxide (50 nm)/aluminium nitride (25 nm)/aluminium oxide (50 nm) on PET substrate Barrier properties of the above three samples were tested by calcium degradation test method with qualitative analysis. The calcium degradation test provides visual qualitative information on defects such as pinholes cracks and nanopores, because the permeated water vapour diffuses through defects of the substrate and its barrier layer(s), and reacts with the calcium sensor. It is well known that micro-pores and sub-micron sized pores such as pinholes and cracks in a transparent coating are very difficult to discern or to study even by sophisticated surface microscopy techniques (e.g. SEM).

Figure 8:
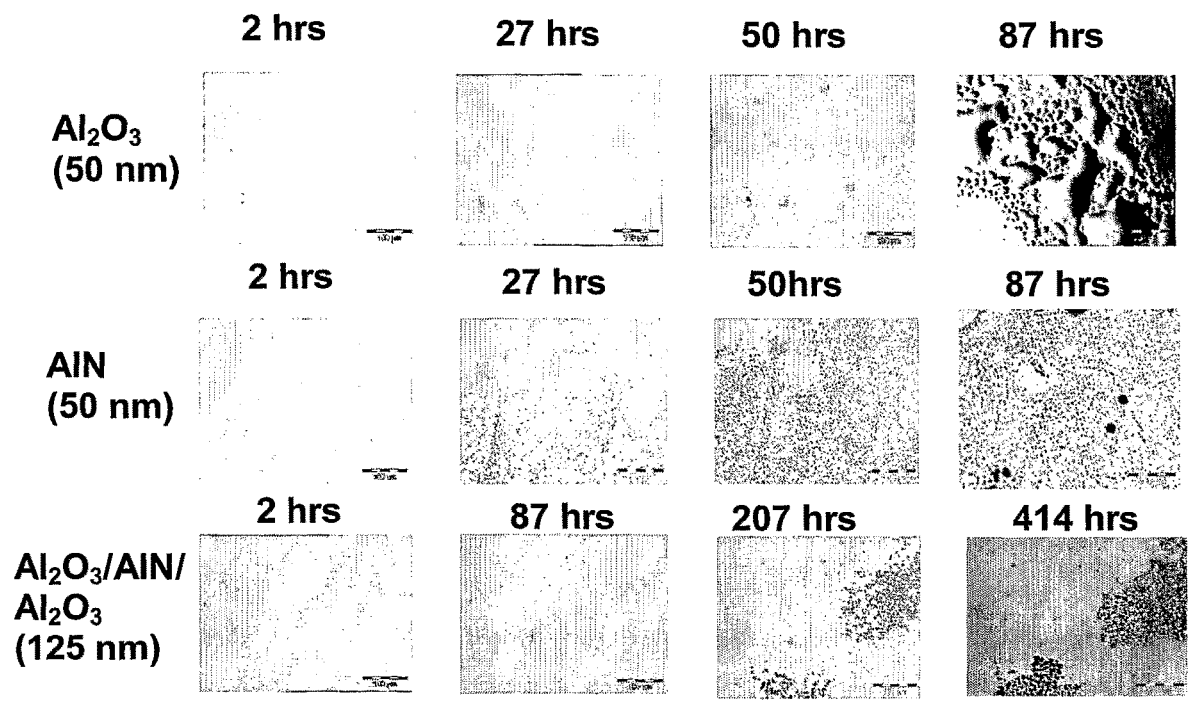
FIG. 8 shows the results of a calcium degradation test study carried out at a temperature of 60° C. with a relative humidity of 90% to determine the barrier properties of three different inorganic bather film configurations. A 100 μm scale bar is indicated at the right bottom of every image. The first row in FIG. 8 shows the results of the degradation test using a 50 nm aluminium oxide film ($Al_2O_3$) while the second row shows the results of the degradation test using a 50 nm aluminium nitride film (AlN). After 27 h the calcium sensor shows first signs of degradation for the $Al_2O_3$ as well as the AlN film. After 87 h calcium is completely degraded when using the $Al_2O_3$ film. The third row in FIG. 8 shows the results of the degradation test using a 125 nm graded barrier film consisting of a 50 nm $Al_2O_3$ layer, a 25 nm AlN layer and a further 50 nm $Al_2O_3$ layer. Only after 207 h the calcium sensor showed first signs of degradation and was less degraded after 414 hours than the AlN film (second row) after 50 hours.

The qualitative calcium degradation images of FIG. 8 show that Sample 3 with graded barrier film structure demonstrated significantly high barrier properties. The calcium sensor in Sample 1 started to degrade after 27 h and the entire calcium degraded before 87 hours. However, the calcium sensor fabricated onto the graded barrier film (sample 3) did not shown any degradation till 207 h. Sample 1 with conventional aluminium oxide and Sample 2 with aluminium nitride have demonstrated poor bather properties. From the results shown from the following Table 1, it is clear that the aluminium nitride film can efficiently reduce the intrinsic stress of barrier structure in a graded bather film having an overall thickness of 125 nm thickness. Table 1 also shows the results of other barrier film structures not described previously herein. It can therefore be concluded that the bather properties were successfully increased.

TABLE 1

Comparative water vapor transport properties analysis of different barrier film coated plastic substrates

| Barrier Films | Process | Lag time - No calcium degradation observed after | WVTR properties |
|---|---|---|---|
| 188 μm PET/Al$_2$O$_3$ (50 nm) | Sputtering (balanced magnetron) | 9 hours | 0.1 g/m$^2$/day at 50° C. & 90% RH |
| 188 μm PET/SiN (50 nm) | Sputtering (balanced magnetron) | 8 hours | 0.24 g/m$^2$/day at 50° C. & 90% RH |
| 188 μm PET/undercoat*[2] (2 μm)/SiN (50 nm) | Sputtering (balanced magnetron) | 27 hours | 0.10 g/m$^2$/day at 50° C. & 90% RH |
| PET (133 μm)/Al$_2$O$_3$ (50 nm) | FCVA | 3.5 hours | 0.14 g/m$^2$/day at 50° C. & 90% RH |
| PET (133 μm)/undercoat*[2] (2 μm)/Al$_2$O$_3$ (50 nm) | FCVA | 4 hours | 0.08 g/m$^2$/day at 50° C. & 90% RH |
| 50 μm PET/Al$_2$O$_3$ (50 nm thickness) | Sputtering (unbalanced magnetron) | 29 hours | 0.07 g/m$^2$/day at 50° C. & 90% RH |
| 188 μm PEN/Al$_2$O$_3$ (50 nm thickness) | Sputtering (balanced magnetron) | 6 hours | 50° C. & 90% RH |
| 188 μm PEN/Al$_2$O$_3$ (110 nm thickness) | Sputtering (balanced magnetron) | 2 hours | 60° C. & 90% RH |
| 188 μm PEN/Al$_2$O$_3$ (50 nm thickness) | Sputtering (balanced magnetron) | 28 hours | 60° C. & 90% RH |
| 188 μm PEN/Al$_2$O$_3$/AlN/Al$_2$O$_3$ (125 nm thickness) Graded Barrier Structure | Sputtering (balanced magnetron) | 207 hours | 60° C. & 90% RH*[1] |

FCVA—filtered cathodic vacuum arc technique

*[1]Based on preliminary data, the WVTR properties are about $10^{-2}$ to $10^{-3}$ g/m$^2$/day at 60° C. & 90% RH

*[2]the undercoat is made of acrylic polymer

The invention claimed is:

1. A graded barrier film comprising a layered structure, wherein said layered structure comprises:
   a first layer comprising a metal oxide or metal nitride;
   a second intermediate layer comprising alternating layers of a metal nitride and metal oxynitride or alternating layers of a metal oxide and metal oxynitride which is arranged on said first layer; and
   a third layer comprising a metal oxide or metal nitride, which is arranged on said second intermediate layer;
   wherein the first layer and the third layer has a thickness up to 60 nm;
   wherein the metal oxide, metal nitride and metal oxynitride comprise a metal which is reactive towards moisture and/or oxygen;
   wherein the vapor permeation rate of the graded barrier film is $10^{-2}$ g/m$^2$/day or less at 60° C. and 90% relative humidity; and
   wherein the metal of the metal oxide, metal nitride and metal oxynitride is the same.

2. The graded barrier film of claim 1, wherein the second intermediate layer has a thickness of at least 1 nm to 20 nm.

3. The graded barrier film of claim 1, wherein the first layer has a thickness of about 50 nm to about 60 nm.

4. The graded barrier film of claim 1, wherein the third layer has a thickness of about 50 nm to about 60 nm.

5. The graded barrier film of claim 1, wherein the entire graded barrier film has a thickness between about 50 nm to about 1 µm, or about 50 nm to about 500 nm, or about 50 nm to about 300 nm, or about 50 nm to about 200 nm, or about 50 nm to about 100 nm.

6. The graded barrier film of claim 1, wherein said graded barrier film is arranged on a substrate.

7. The graded barrier film of claim 6, wherein said graded barrier film is arranged on opposing sides of said substrate.

8. The graded barrier film of claim 6, wherein said substrate is an organic polymer or an inorganic polymer or a mixture thereof.

9. The graded barrier film of claim 8, wherein said organic polymer is selected from the group consisting of polyacetate, polypropylene, cellophane, poly(l-trimethylsilyl-1-propyne, poly(ethylene-2,6-naphthalene dicarboxylate) (PEN), poly(ethylene terephthalate) (PET), poly(4-methyl-2-pentyne), polyimide, polycarbonate (PC), polyethylene, polyethersulfone, epoxy resins, polyethylene terephthalate, polystyrene, polyurethane, polyacrylate, polyacrylamide, polydimethylphenylene oxide, styrene-divinylbenzene copolymers, polyvinylidene fluoride (PVDF), nylon, nitrocellulose, cellulose and acetate.

10. The graded barrier film of claim 8, wherein said inorganic polymer is selected from the group consisting of silica (glass), nano-clays, silicones, polydimethylsiloxanes, biscyclopentadienyl iron, indium tin oxide, polyphosphazenes and derivatives thereof.

11. The graded barrier film of claim 8, wherein said polymers are transparent or semi-transparent or opaque.

12. The graded barrier film of claim 1, wherein the metal used in said layers is selected from the group consisting of metals from periodic groups 2 to 14 or wherein metal used in said layers is selected from the group consisting of aluminum, gallium, indium, indium-doped tin, thallium, titanium, zirconium, hafnium, molybdenum, chromium, tungsten, zinc, silicon, germanium, tin, barium, strontium, calcium, magnesium, manganese, tantalum, yttrium and vanadium.

13. The graded barrier film of claim 1, wherein said graded barrier film comprises multiple layers; wherein a metal oxide layer is always followed by an intermediate layer comprising a metal nitride layer or metal oxynitride layer which is arranged on said metal oxide layer.

14. The graded barrier film of claim 1, wherein an additional film is arranged on said graded barrier film, wherein said additional film is selected from the group consisting of a UV neutralizing film, a zinc oxide layer, a protective layer and a barrier film.

15. The graded barrier film according to claim 14, wherein said additional film is arranged only on one side of said graded barrier film or on both sides.

16. The graded barrier film of claim 1, wherein the vapor permeation rate of the graded barrier film is between about $1\times10^{-2}$ g/m$^2$/day and $1\times10^{-3}$ g/m$^2$/day at 60° C. and 90% relative humidity.

17. The graded barrier film of claim 1, wherein the first layer and the third layer has a thickness of 1 nm to 60 nm.

18. A method of manufacturing a graded barrier film according to claim 1 by carrying out multiple times of a single deposition cycle using sputtering technology, wherein said method comprises:
depositing at least one monolayer of metal on a substrate;
feeding oxygen with a working gas for anodizing said metal layer to form the first layer;
depositing at least one monolayer of metal on the first layer; and
feeding nitrogen with a working gas or feeding a mixture of nitrogen and oxygen with a working gas for anodizing said metal layer to form the second layer.

19. The method of claim 18, wherein said sputtering technology is magnetron sputtering or radio frequency (RF) sputtering or direct current (DC) sputtering.

* * * * *